United States Patent
Stormes et al.

(10) Patent No.: US 10,826,489 B1
(45) Date of Patent: Nov. 3, 2020

(54) SELECTION CIRCUIT (71) Applicant: MARVELL INTERNATIONAL LTD., Hamilton (BM)

(72) Inventors: Joseph F. Stormes, Burlington, VT (US); John A. Fifield, Burlington, VT (US); Darren L. Anand, Williston, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/433,567

(22) Filed: Jun. 6, 2019

(51) Int. Cl.
*H03K 17/687* (2006.01)
*G11C 7/10* (2006.01)

(52) U.S. Cl.
CPC ......... *H03K 17/687* (2013.01); *G11C 7/1087* (2013.01)

(58) Field of Classification Search
CPC ........ G11C 7/00; G11C 7/1087; H03K 17/00; H03K 17/04123; H03K 17/063; H03K 17/168; H03K 17/687; H03K 17/6874
USPC ........................................................ 327/434
See application file for complete search history.

(56) References Cited

U.S. PATENT DOCUMENTS

| | | | | |
|---|---|---|---|---|
| 4,812,672 A * | 3/1989 | Cowan | .................... | H02J 9/061 307/43 |
| 5,945,816 A * | 8/1999 | Marusik | .................... | G05F 1/56 307/86 |
| 6,847,249 B1 * | 1/2005 | Brokaw | ............... | H03K 17/693 327/407 |
| 7,893,566 B2 | 2/2011 | Yarbrough et al. | | |
| 8,129,862 B2 * | 3/2012 | Audy | ........................ | H02J 1/10 307/80 |
| 9,787,135 B2 * | 10/2017 | Yasukawa | ............... | H02J 9/061 |
| 10,452,113 B2 * | 10/2019 | Au Yeung | ................. | G05F 1/10 |
| 2006/0012415 A1 * | 1/2006 | Chen | ............... | H03K 3/356113 327/333 |
| 2007/0126482 A1 * | 6/2007 | Khan. P | ............... | H03K 5/2472 327/77 |
| 2007/0176666 A1 * | 8/2007 | Arslan | ................... | H03K 3/012 327/333 |
| 2010/0231051 A1 * | 9/2010 | Yarbrough | ............. | H03K 3/356 307/80 |
| 2014/0285239 A1 * | 9/2014 | Zanetta | ................ | H03K 17/693 327/64 |

* cited by examiner

Primary Examiner — Lincoln D Donovan
Assistant Examiner — Dave Mattison (57) ABSTRACT

The present disclosure relates to a structure including a voltage selection circuit which includes a first device and a second device, the voltage selection circuit is configured to output a higher voltage of a first supply voltage and a second supply voltage through one of the first device and the second device, and a voltage difference between the first supply voltage and the second supply voltage is less than a threshold voltage.

21 Claims, 5 Drawing Sheets

SELECTION CIRCUIT

FIELD OF THE INVENTION

The present disclosure relates to a selection circuit, and more particularly, to a N-WELL selection circuit and a method of use.

BACKGROUND

In complementary metal-oxide-semiconductor (CMOS) integrated circuits which operate on a plurality of supply voltages, PFETs usually need to bias their N-WELLs to a higher supply voltage of the plurality of supply voltages. In an example of two supply voltages, a first supply voltage level or a second supply voltage level may be present on a source-drain (SD) diffusion terminal depending on an operating mode. In CMOS integrated circuits, a comparator circuit is usually needed to determine which voltage supply is higher and gate the determined voltage supply to selected N-WELL structures to avoid forward biasing the SD diffusion to the N-WELL. For this reason, the first supply voltage or the second supply voltage level cannot be hardwired to the N-WELL.

In order to avoid forward biasing the SD diffusion to the N-WELL, a sense latch structure and a strobe input can perform a voltage comparison between a voltage input and a supply voltage. In this known circuitry, a mixed power supply latch can be controlled by the strobe input. However, this circuitry requires a specific timing requirement between the voltage input and the strobe. Therefore, once the strobe and a voltage input are asserted, the circuit may become unresponsive to changes in voltage input levels.

In another approach to avoid forward biasing the SD diffusion to the N-WELL, a known circuit may include a latch which assists in controlling an output voltage selector. In the known circuitry, cross-coupled PFETS have drains connected to a common output. In such known circuitry, the output will always rise to a higher voltage supply. In this approach, the PFET/NFET ratios are critical for the circuit to operate correctly, which also consume large amounts of current and does not operate at low voltage conditions. In this approach, large devices are also required for the circuit to operate correctly.

SUMMARY

In an aspect of the disclosure, a structure includes a voltage selection circuit which includes a first device and a second device, the voltage selection circuit is configured to output a higher voltage of a first supply voltage and a second supply voltage through one of the first device and the second device, and a voltage difference between the first supply voltage and the second supply voltage is less than a threshold voltage.

In another aspect of the disclosure, a circuit includes a PFET circuitry including a first device and a second device such that the PFET circuitry is configured to output a higher voltage of a first supply voltage and a second supply voltage through one of the first device and the second device, and a gate control circuitry which includes a third device with an NWELL connected to the output signal, a source connected to the second supply voltage, and a drain connected to a gate of a fourth device with its NWELL connected to the output signal, a source connected to the first supply voltage, and a drain connected to the gate of the third device. A voltage difference between the first supply voltage and the second supply voltage is less than a threshold voltage.

In another aspect of the disclosure, a method includes generating a bias voltage in response to a voltage difference between a first supply voltage and a second supply voltage being less than a threshold voltage, and outputting an output signal to a higher voltage of the first supply voltage and the second supply voltage in response to the generated bias voltage.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a selection circuit, and more particularly, to a N-WELL selection circuit. In embodiments, the N-WELL selection circuit can be a cross-coupled PFET power supply N-WELL selection circuit. In more specific embodiments, the cross-coupled PFET power supply N-WELL selection circuit includes a gate control circuitry, a gate bias circuitry, and a standby mode (low power mode) circuitry. Advantageously, by implementing the circuit disclosed herein, less current is drawn compared to known circuitry. Further, by implementing the circuit disclosed herein, the transition between power supplies is faster in comparison to conventional circuitry, and in addition, there is no need for a strobe to avoid forward biasing the SD diffusion to the N-WELL.

Figure 1:
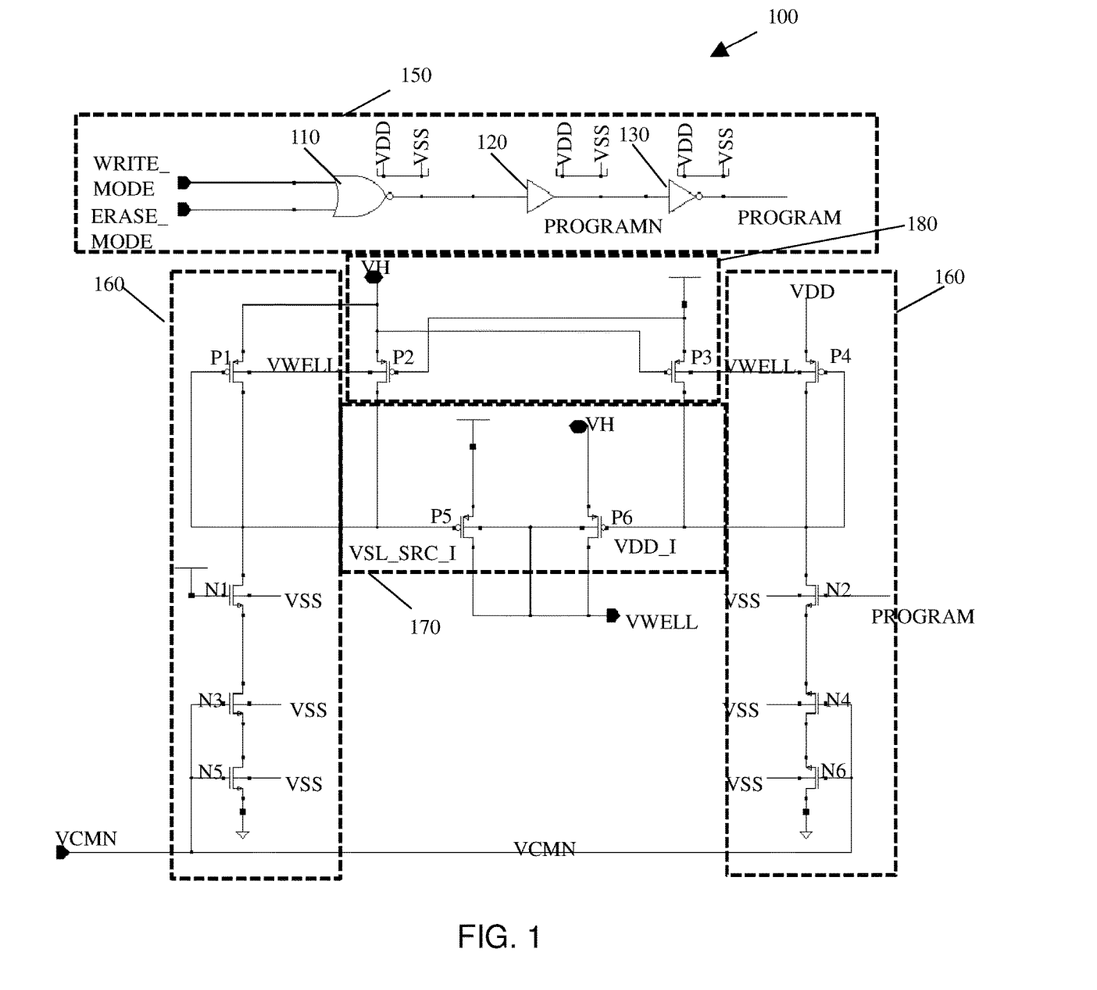
FIG. 1 shows an overview of an N-WELL selection circuit in accordance with aspects of the present disclosure.

FIG. 1 shows an N-WELL selection circuit in accordance with aspects of the present disclosure. In embodiments the N-WELL selection circuit 100 includes a standby (low power) mode control circuitry 150, a gate bias circuitry 160, a MUX PFET circuitry 170, and a gate control circuitry 180.

In embodiments, the standby (low power) mode control circuitry 150 includes a NOR gate 110 which receives a WRITE_MODE input and an ERASE_MODE input, and outputs a signal to a buffer 120. The buffer 120 of the standby (low power) mode control circuitry 150 outputs a PROGRAMN signal to an inverter 130. The inverter 130 of the standby (low power) mode control circuit 150 inverts the output of the buffer 120 (i.e., PROGRAMN signal) and outputs a PROGRAM signal. The PROGRAM and PROGRAMN signals are used to set whether the N-WELL selection circuit 100 is in a normal power mode or a standby (low power) mode.

In embodiments, the gate bias circuitry 160 includes a PMOS transistor P4 which has an NWELL connected to the output signal VWELL. A source of the PMOS transistor P4 is connected to a second power supply signal VDD, and a drain is connected to a drain of NMOS transistor N2. The gate of the NMOS transistor N2 is connected to the PROGRAM signal (i.e., from the output of the inverter 130) and the source is connected to a drain of NMOS transistor N4. The gate of the NMOS transistor N4 is connected to a current source signal VCMN, and the source is connected to a drain of NMOS transistor N6. The gate of the NMOS transistor N6 is also connected to the current source signal VCMN and the source is connected to ground.

The gate bias circuitry 160 also includes a PMOS transistor P1 which has an NWELL connected to the output signal VWELL, a source connected to a first power supply signal VH, and a drain connected to a drain of a NMOS transistor N1. The PWELL of the NMOS transistor N1 is connected to a power supply signal VSS and a source connected to a drain of the NMOS transistor N3. The gate of the NMOS transistor N3 is connected to the current source signal VCMN and the source is connected to a drain of NMOS transistor N5. The gate of the NMOS transistor N5 is connected to the current source signal VCMN and the source is connected to ground. The power supply signal VSS is connected to the PWELL of NMOS transistors N1-N6.

Still referring to FIG. 1, the MUX PFET circuitry 170 includes a PMOS transistor P5 which has a source connected to the second power supply signal VDD, a gate connected to the voltage source line input node VSL_SRC_I, and a drain connected to the output signal VWELL. The MUX PFET circuitry 170 also includes a PMOS transistor P6 which has a source connected to the first power supply signal VH, a gate connected to a power supply input node VDD_I, and a drain connected to the output signal VWELL. The gate of the PMOS transistor P5 is also connected to the gate of the PMOS transistor P1, and the gate of the PMOS transistor P6 is connected to the gate of the PMOS transistor P4. The NWELLs of P1, P5, P4, and P6 are connected to output signal VWELL.

The gate control circuitry 180 includes a PMOS transistor P2 which has a source connected to the first power supply signal VH, a gate connected to the second power supply VDD, and a drain connected to the voltage source line input node VSL_SRC_I. The gate control circuitry 180 also includes a PMOS transistor P3 which has a source connected to the second power supply signal VDD and a drain connected to the power supply input node VDD_I. The NWELLS of PMOS transistors P2 and P3 are connected to output node VWELL. Moreover, the PMOS transistors P5, P6 have sources connected to the second power supply signal VDD and the first power supply signal VH, respectively, and have drains connected to the output signal VWELL.

In operation of the N-WELL selection circuit 100, the MUX PFET circuitry 170 continuously monitors the first power supply signal VH and the second power supply signal VDD and outputs the higher of the two to output signal VWELL.

The voltage source line input node VSL_SRC_I of the MUX PFET circuit 170 is configured to pass the second power supply signal VDD through the PMOS transistor P5 to the output signal VWELL when the second power supply signal VDD is greater than the first power supply signal VH. Further, the power supply input node VDD_I of the MUX PFET circuitry 170 is configured to pass the first power supply signal VH through the PMOS P6 to the output signal VWELL when the first power supply signal VH is greater than the second power supply signal VDD.

The PMOS transistor P1 and NMOS transistors N1, N3, and N5 of the gate bias circuitry 160 generate a first bias voltage (i.e., the first bias voltage is approximately a value of the first power supply signal VH minus a threshold voltage Vt minus 50 millivolts) to allow the PMOS transistor P5 to conduct when the second power supply signal VDD is higher (e.g., approximately 0.01 volts) than the first power supply signal VH. Further, the PMOS transistor P4 and NMOS transistors N2, N4, and N6 of the gate bias circuitry 160 generate a second bias voltage (i.e., the second bias voltage is approximately a value of the second power supply signal VDD minus the threshold voltage Vt minus 50 millivolts) to allow the PMOS transistor P6 to conduct when the first power supply signal VH is higher than the second power supply signal VDD. Accordingly, the gate bias circuitry 160 ensures that a correct output voltage is generated when the first power supply signal VH and the second power supply signal VDD are less than a threshold voltage Vt apart.

Still referring to the operation of the N-WELL selection circuit 100, by selecting the first power supply signal VH or the second power supply signal VDD, the cross-coupled PMOS transistors P2, P3 can bring the gate of the unselected PMOS transistor P5 (or P6) up to a source voltage to cut the unselected PMOS transistor P5 (or P6) off completely. The gate bias circuitry 160 consumes a small amount of DC current and can be shut off when both the WRITE_MODE input and the ERASE_MODE input are asserted at a low value. Further, in this standby low power mode, the first power supply signal VH is set to be equal to the second power supply signal VDD. In this standby low power mode (i.e., a disabled mode), the NOR gate 110, the buffer 120, and the inverter 130 output PROGRAMN and PROGRAM signals (which are VDD level signals).

The PROGRAMN and PROGRAM signals are used to disable the PMOS transistor P6 by forcing the gate of the PMOS transistor P6 to the first power supply signal VH and disabling the NMOS transistor N2 with the PROGRAMN signal. Also, the PMOS transistor P5 is turned on by conducting the voltage source line input node VSL_SRC_I through NMOS transistors N1, N3, N5 to ground.

Figure 2:
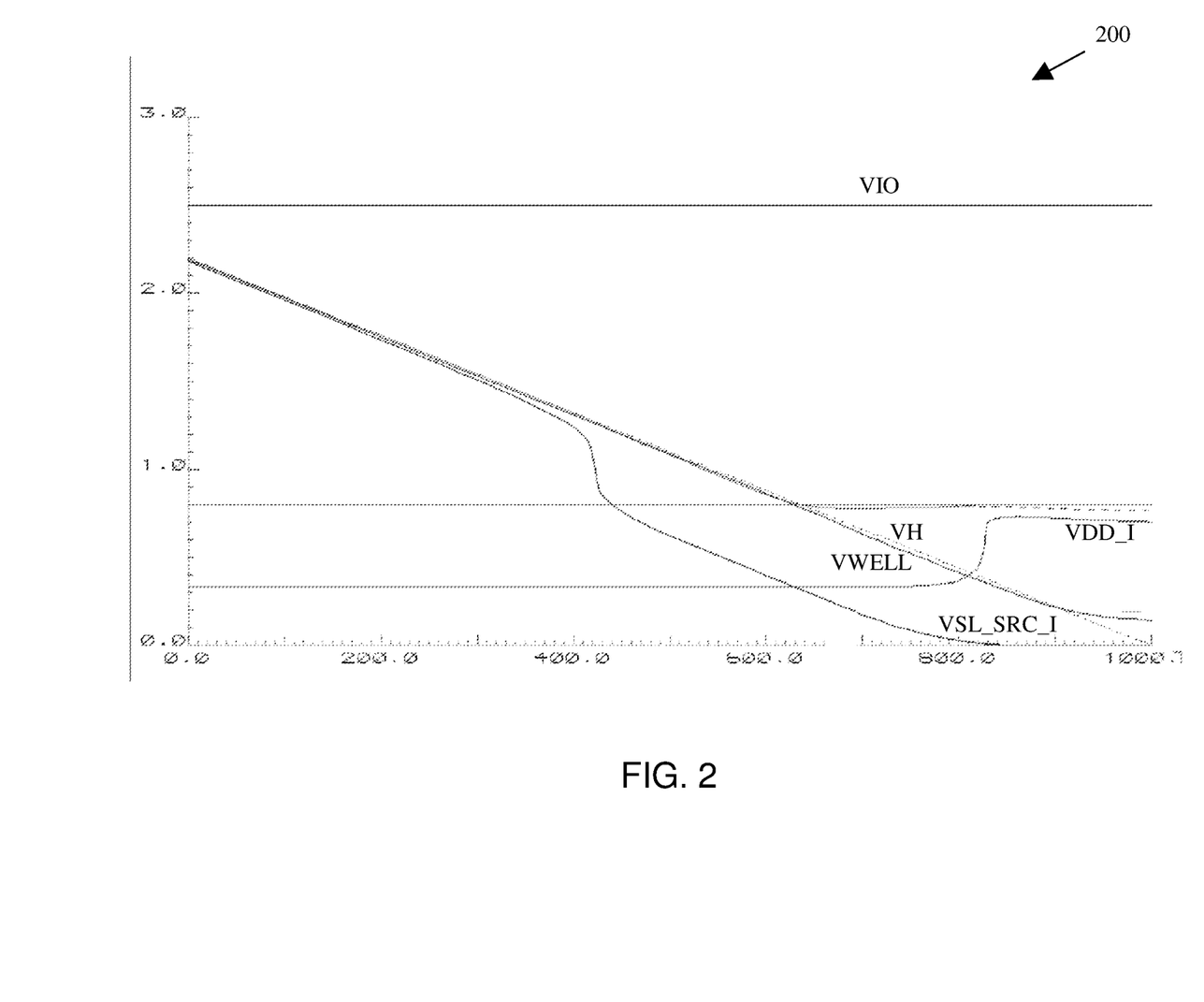
FIG. 2 shows a graph of voltage characteristics of the N-WELL selection circuit of FIG. 1 in accordance with aspects of the present disclosure.

FIG. 2 shows a graph of voltage characteristics of the N-WELL selection circuit of FIG. 1, in accordance with aspects of the present disclosure. In FIG. 2, time is shown on the x-axis and voltage is shown on the y-axis. An input voltage VIO is approximately 2.5 volts which is also the power supply for a 2.x volt regulator. The power supply input node VDD_I (i.e., a control node of the N-WELL selection circuit 100) is biased at the second power supply signal VDD minus the threshold voltage Vt minus 50 millivolts to allow the first power supply signal VH to pass when the first power supply signal VH is higher than the second power supply signal VDD. The voltage source line input node VDD_I (i.e., another control node of the N-WELL selection circuit 100) is forced to be approximately the second power supply signal VDD when the second power supply signal VDD is higher than the first power supply signal VH. The voltage source line input node VSL_SRC_I is forced to the first power supply signal VH when the first power supply signal VH is higher than the second power supply signal VDD. As shown, the voltage of the output signal VWELL follows the second power supply signal VDD.

Figure 3:
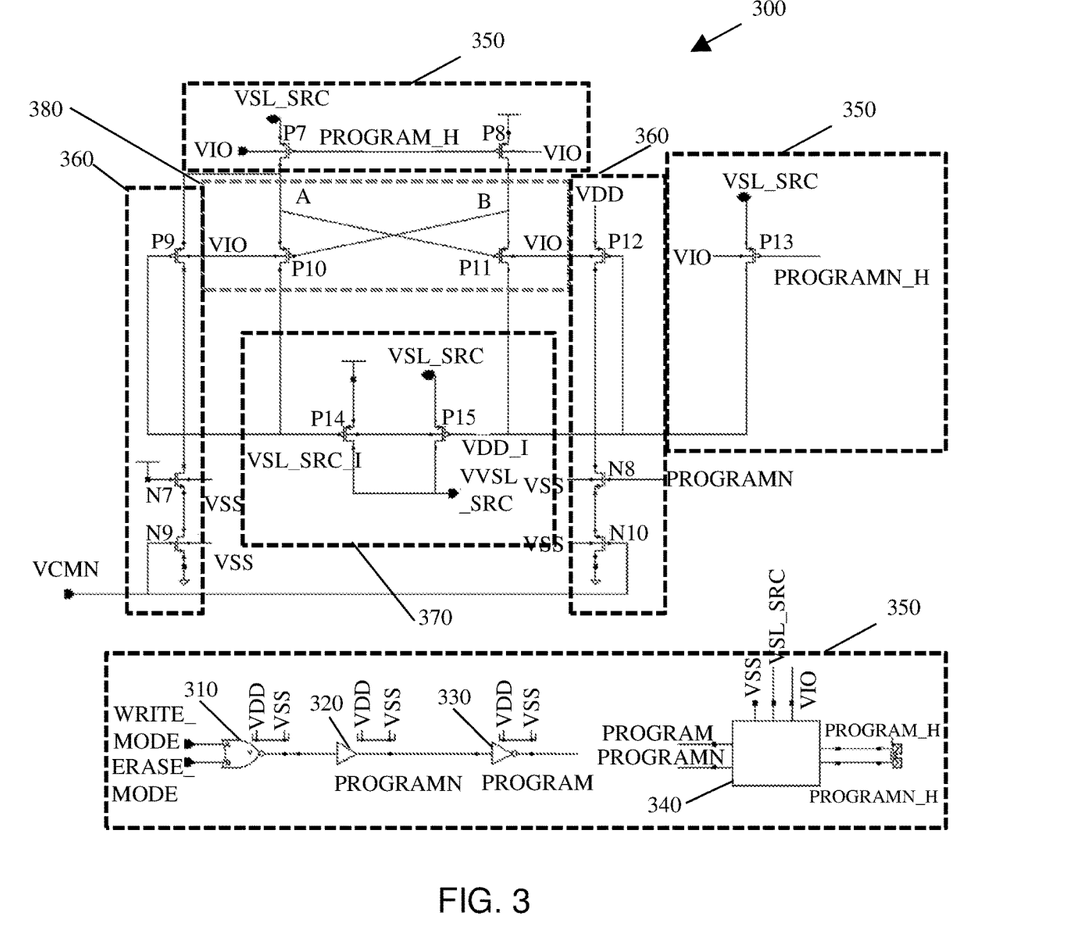
FIG. 3 shows an overview of an N-WELL selection circuit in accordance with additional aspects of the present disclosure.

FIG. 3 shows an overview of an N-WELL selection circuit 300 in accordance with additional aspects of the present disclosure. In FIG. 3, a standby (low power) mode control circuitry 350 includes PMOS transistors P7, P8, P13 and a level translator 340.

The PMOS transistor P7 has an NWELL connected to an input voltage signal VIO, a source connected to a first power supply signal VSL_SRC, and a drain connected to a source of PMOS transistor P9. The PMOS transistor P8 has an NWELL connected to the input signal VIO, a source connected to a second power supply signal VDD, and a drain connected to a source of PMOS transistor P11. The PMOS transistor P13 has a gate connected to a PROGRAM_H signal, a source connected to the first power supply signal VSL_SRC, and a drain connected to the power supply input node VDD_I. Moreover, a level translator 340 receives the PROGRAM signal, the PROGRAMN signal, the first power supply signal VSL_SRC, the power supply signal VSS, and the input voltage signal VIO, and outputs a PROGRAM_H and PROGRAMN_H signal.

As in the N-WELL selection circuit 100 of FIG. 1, the standby (low power) mode control circuitry 350 also includes a NOR gate 310, a buffer 320, and an inverter 330. The NOR gate 310 receives a WRITE_MODE input and an ERASE_MODE input and outputs a signal to the buffer 320. The buffer 320 outputs the PROGRAMN signal to the inverter 330. Then, the inverter 330 inverts the output of the buffer 320 (i.e., PROGRAMN signal) and outputs a PROGRAM signal.

Still referring to FIG. 3, the gate bias circuitry 360 includes a PMOS transistor P12 which has an NWELL connected to an input voltage signal VIO, a source connected to a second power supply signal VDD, and a drain connected to a drain of NMOS transistor N8. The gate of the NMOS transistor N8 is connected to the PROGRAMN signal (i.e., from the output of the buffer 320) and the source is connected to a drain of NMOS transistor N10. The gate of the NMOS transistor N10 is connected to a current source signal VCMN and the source is connected to ground.

The gate bias circuitry 360 also includes a PMOS transistor P9, which has an NWELL connected to the input voltage signal VIO, a source connected to a drain of a PMOS transistor P7, and a drain connected to a drain of a NMOS transistor N7. The PWELL of the NMOS transistor N7 is connected to a power supply signal VSS and a source connected to a drain of the NMOS transistor N9. The gate of the NMOS transistor N9 is connected to the current source signal VCMN and the source is connected to ground. Further, an input voltage signal VIO is connected to the NWELL of the PMOS transistor P13 of the standby (low power) mode control circuitry 350.

The MUX PFET circuitry 370 includes a PMOS transistor P14 which has a source connected to the second power supply signal VDD, a gate connected to the voltage source line input node VSL_SRC_I, and a drain connected to an output signal VVSL_SRC. The cross-coupled PFET circuitry 370 also includes a PMOS transistor P15 which has a source connected to the first power supply signal VSL_SRC, a gate connected to a power supply input node VDD_I, and a drain connected to the output signal VVSL_SRC. The gate of the PMOS transistor P15 is connected to the drain of the PMOS transistor P13.

The gate control circuitry 380 includes a PMOS transistor P10 which has a source connected to the drain of PMOS transistor P7, a gate connected to a source of PMOS transistor P11, and a drain connected to the voltage source line input node VSL_SRC_I. The gate control circuitry 380 also includes a PMOS transistor P11 which has a source connected to the drain of PMOS transistor P8, a gate connected to a source of PMOS transistor P10, and a drain connected to the power supply input node VDD_I. Further, the gate of the PMOS transistor P10 is connected to Node B and the gate of the PMOS transistor P11 is connected to Node A. The PMOS transistors P14, P15 also have sources connected to the second power supply signal VDD and the first power supply signal VSL_SRC, respectively, and have drains connected to the output signal VVSL_SRC.

In the operation of the NWELL selection circuit 300 of FIG. 3, the MUX PFET circuitry 370 continuously monitors and outputs the higher of first power supply signal VSL_SRC or the second power supply signal VDD. The voltage source line input node VSL_SRC_I of the cross-coupled PFET circuitry 370 is configured to pass the second power supply signal VDD through the PMOS transistor P14 to the output signal VVSL_SRC when the second power supply signal VDD is greater than the first power supply signal VSL_SRC. Further, the power supply input node VDD_I of the cross-coupled PFET circuitry 370 is configured to pass the first power supply signal VVSL_SRC through the PMOS P15 to the output signal VVSL_SRC when the first power supply signal VSL_SRC is greater than the second power supply signal VDD.

The PMOS transistor P9 and NMOS transistors N7, N9 of the gate bias circuitry 360 generate a first bias voltage (i.e., the first bias voltage is approximately a value of the first power supply signal VSL_SRC minus a threshold voltage Vt minus 50 millivolts) to allow the PMOS transistor P14 to conduct when the second power supply signal VDD is higher (e.g., approximately 0.01 volts) than the first power supply signal VSL_SRC. Further, the PMOS transistor P12 and NMOS transistor N8, N10 of the gate bias circuitry 360 generate a second bias voltage (i.e., the second bias voltage is approximately a value of the second power supply signal VDD minus the threshold voltage Vt minus 50 millivolts) to allow the PMOS transistor P15 to conduct when the first power supply signal VSL_SRC is higher than the second power supply signal VDD. In this way, the gate bias circuitry 360 ensures that a correct output voltage is generated when the first power supply signal VSL_SRC and the second power supply signal VDD are less than a threshold voltage Vt apart.

By selecting the first power supply signal VSL_SRC or the second power supply signal VDD, the cross-coupled PMOS transistors P10 and P11 bring the gate of the unselected PMOS transistor P14 or P15 up to a source voltage to cut the unselected PMOS transistor P14 or P15 off completely. The gate bias circuitry 360 consumes a small amount of DC current and can be shut off when both the WRITE_MODE input and the ERASE_MODE input are asserted at a low value. In this standby low power mode, the first power supply signal VSL_SRC is set to be equal to the second power supply signal VDD.

Further, in the standby low power mode (i.e., a disabled mode), the NOR gate 310, the buffer 320, and the inverter 330 output PROGRAMN and PROGRAM signals (which are VDD level signals). The PROGRAMN and PROGRAM signals are converted to the input voltage signal VIO by a level translator 340 and are used to disable PMOS transistor P15 by forcing the gate of the PMOS transistor P15 to the first power supply signal VSL_SRC and disabling NMOS transistor N8 with the PROGRAMN signal. The PMOS transistor P14 is turned on by conducting the voltage source line input node VSL_SRC_I through NMOS transistors N7, N9 to ground. In an example of the standby low power mode (i.e., a disabled mode), the N-WELLs of PMOS transistors P7-P15 are set to a higher level (e.g., approximately 2.5 volts) than the first power supply signal VSL_SRC (e.g., approximately 2.0 volts).

Figure 4:
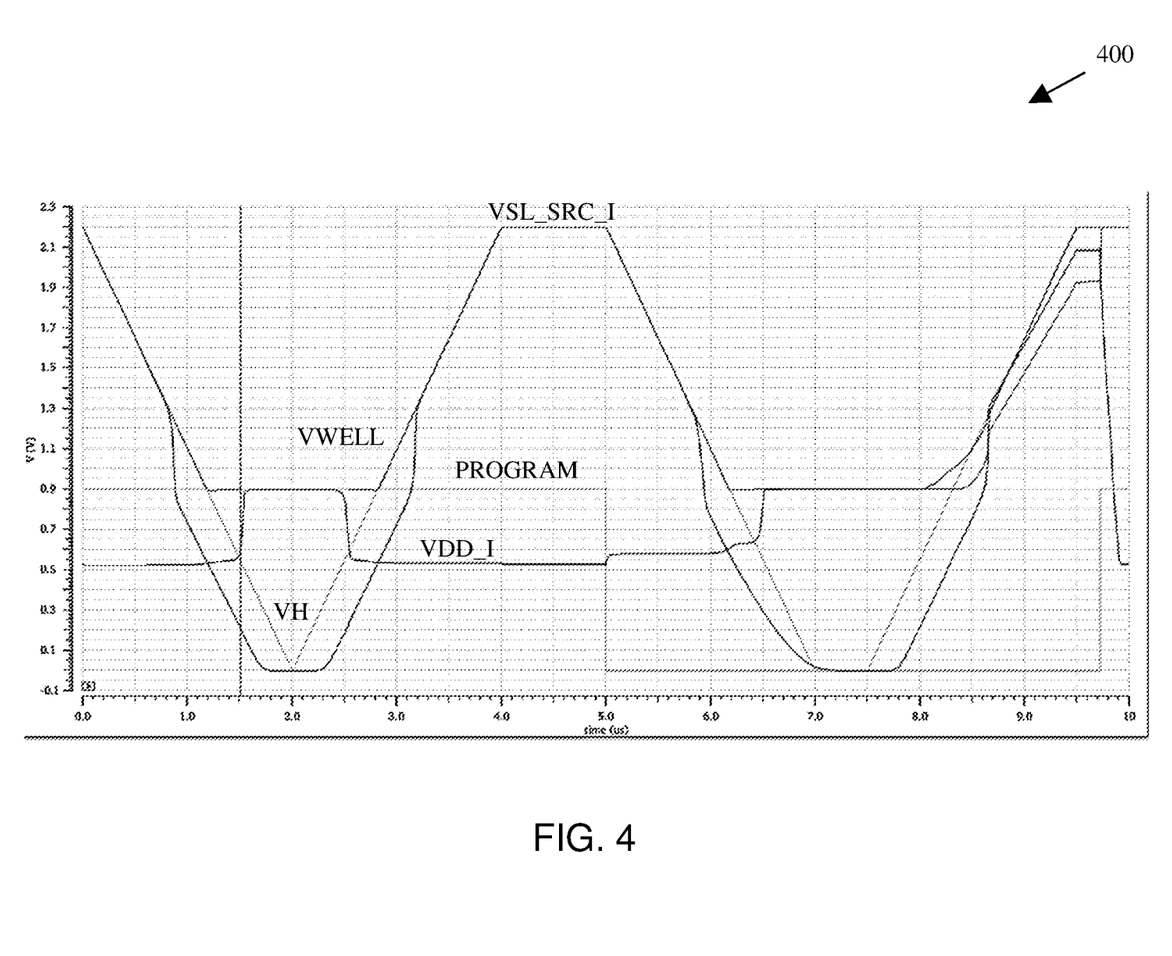
FIG. 4 shows a graph of functional versus standby characteristics of the N-WELL selection circuit of FIG. 1 in accordance with aspects of the present disclosure.

FIG. 4 shows a graph of functional versus standby characteristics of the N-WELL selection circuit of FIG. 1. In FIG. 4, time is shown on the x-axis and voltage is shown on the y-axis. In FIG. 4, after the PROGRAM signal is asserted (i.e., at 0.9 volts for the functional mode), the first power supply signal VH keeps dropping voltage until approximately 2.0 μsec. The voltage source line input node VSL_SRC_I drops voltage until approximately 1.75 μsec. The output signal VWELL drops voltage until it reaches 0.9 volts at approximately 1.25 μsec. Also, the power supply input node VDD_I rises from 0.5 volts to 0.9 volts at approximately 1.5 μsec.

At approximately 2.0 μsec, the first power supply signal VH and the voltage source line input node VSL_SRC_I float up (i.e., rise up) to approximately 2.5 volts. Further, after approximately 2.5 μsec, the power supply input node VDD_I drops down by about 0.5 volts (which represents the power supply input node VDD_I dropping down to a threshold voltage Vt). The output signal VWELL also floats up (i.e., rises up) to the first power supply VH (i.e., approximately 2.5 volts).

Still referring to FIG. 4, at approximately 5.0 μsec, the PROGRAM signal drops down to a standby mode (i.e., low power mode, at approximately 0.5 volts). Further, in the standby mode (i.e., low power mode) the first power supply VH and the voltage source line input node VSL_SRC_I has a voltage drop to approximately 0 volts. Therefore, as shown in FIG. 4, the standby mode (i.e., low power mode) has a low voltage and low current for the N-WELL selection circuit 100. Then, at approximately 7.5 μsec, the first power supply VH, the voltage source line input node VSL_SRC_I, the power supply input node VDD_I, and the output signal VWELL will rise up. In particular, the power supply input node VDD_I will float up to the first power supply VH.

Figure 5:
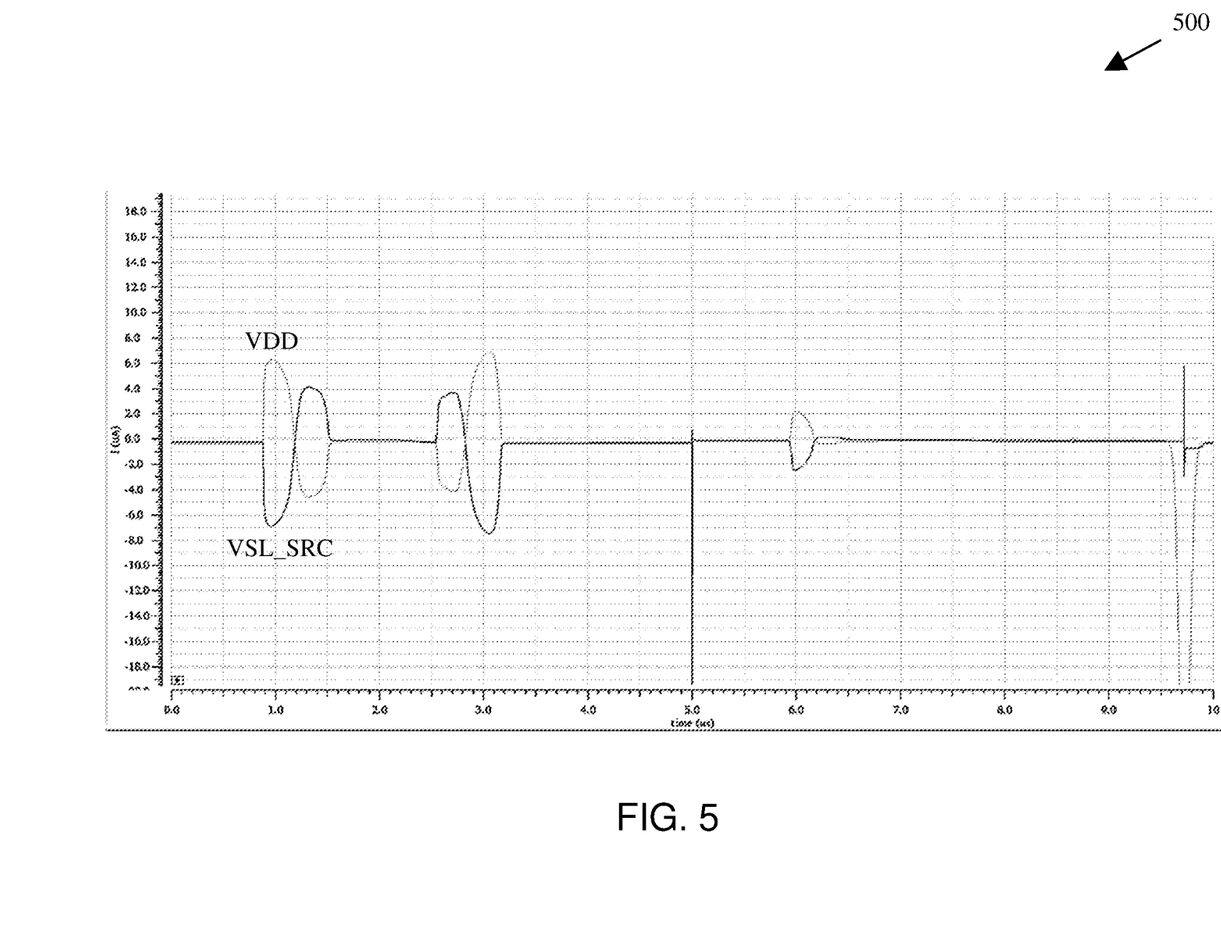
FIG. 5 shows another graph of functional versus standby characteristics of the N-WELL selection circuit of FIG. 1 in accordance with aspects of the present disclosure.

FIG. 5 shows another graph of functional versus standby characteristics of the N-WELL selection circuit of FIG. 1. In FIG. 5, time is shown on the x-axis and voltage is shown on the y-axis. In FIG. 5, after the PROGRAM signal is asserted for the functional mode (i.e., between 0 and 5 μsec), the second power supply signal VDD and the first power supply signal VSL_SRC alternate. In this way, the second power supply signal VDD is at a high level when the first power supply signal VSL_SRC is at a low level and the second power supply signal VDD is at a low level when the first power supply signal VSL_SRC is at a high level. Further, as shown in FIG. 5, the PROGRAM signal drops down to a standby mode (i.e., low power mode, at approximately 5.0 μsec). In the standby mode (i.e., low power mode), the N-WELL selection circuit 100 has a low voltage and a low current, reducing power consumption.

The circuit and the method for a cross-coupled PFET power supply N-WELL selection circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a cross-coupled PFET power supply N-WELL selection circuit of the present disclosure has been adopted from integrated circuit (IC) technology. For example, the structures are built on wafers and are realized in films of material patterned by photolithographic processes on the top of a wafer. In particular, the fabrication of the circuit and the method for a cross-coupled PFET power supply N-WELL selection circuit uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A voltage selection comprising:
  a first device and a second device connected to output an output signal, wherein the voltage selection circuit is configured to output a higher voltage of a first supply voltage and a second supply voltage through one of the first device and the second device, and wherein a voltage difference between the first supply voltage and the second supply voltage is less than a threshold voltage; and
  a third device comprising an NWELL having a same voltage potential as the output signal.

2. The voltage selection circuit of claim 1, wherein the first device is a PMOS transistor which has a source at the voltage potential of the first supply voltage.

3. The voltage selection circuit of claim 2, wherein the second device is a PMOS transistor which has a source at the voltage potential of the second supply voltage.

4. The voltage selection circuit of claim 3, wherein:
  a drain of the first device is connected to a drain of the second device and;
  the drain of the first device and the drain of the second device provide the output signal.

5. The voltage selection circuit of claim 4, wherein the third device comprises:
  a source at a same voltage potential as the second supply voltage;
  a gate at a same voltage potential as the first supply voltage; and
  a drain connected to a gate of a fourth device.

6. The voltage selection circuit of claim 4, further comprising a fourth device comprising:
   an NWELL at a same voltage potential as the output signal;
   a source at a same voltage potential as the first supply voltage;
   a gate at a same voltage potential as the second supply voltage; and
   a drain connected to a gate of the third device.

7. The voltage selection circuit of claim 6, further comprising a gate bias circuitry which includes:
   a fifth device with an NWELL at the same voltage potential as the output signal and a source at the same voltage potential as the first supply voltage; and
   a sixth device with an NWELL at the same voltage potential as the output signal and a source at the same voltage potential as the second supply voltage.

8. The voltage selection circuit of claim 7, further comprising disabling the second device by forcing a gate node of the second device to a value of the first supply voltage.

9. The voltage selection circuit of claim 7, further comprising disabling the first device by forcing a gate node of the first device to a value of the second supply voltage.

10. A circuit comprising:
    a p-channel field effect transistor circuit comprising a first device and a second device such that the p-channel field effect transistor circuit is configured to output a higher voltage of a first supply voltage and a second supply voltage through one of the first device and the second device, wherein the first device and the second device are connected to output an output signal; and
    a gate control circuit comprising
      a third device comprising
        an NWELL at a same voltage potential as the output signal,
        a source at a same voltage potential as the second supply voltage, and
        a drain at the same voltage potential as a gate of a fourth device, and
      the fourth device comprising
        an NWELL at the same voltage potential as the output signal,
        a source at the same voltage potential as the first supply voltage, and
        a drain at the same voltage potential as the gate of the third device, and
      a voltage difference between the first supply voltage and the second supply voltage is less than a threshold voltage.

11. The circuit of claim 10, wherein:
    the first device is a PMOS; and
    the PMOS transistor comprises a source at the same voltage potential as the first supply voltage.

12. The circuit of claim 11, wherein:
    the second device is a PMOS transistor; and
    the PMOS transistor comprises a source at the same voltage potential as the second supply voltage.

13. The circuit of claim 11, wherein each of the first device and the second device includes a drain at the same voltage potential as the output signal.

14. The circuit of claim 12, further comprising a gate bias circuit, wherein:
    the gate bias circuit comprises a fifth device and a sixth device;
    the fifth device comprises
      an NWELL at the same voltage potential as the output signal, and
      a source at the same voltage potential as the first supply voltage; and
    the sixth device comprises
      an NWELL at the same voltage potential as the output signal, and
      a source at the same voltage potential as the second supply voltage.

15. The circuit of claim 10, further comprising disabling the second device by forcing a gate node of the second device to a value of the first supply voltage.

16. The circuit of claim 10, further comprising disabling the first device by forcing a gate node of the first device to a value of the second supply voltage.

17. The circuit of claim 10, further comprising a standby control circuit comprising a level translator, a NOR gate, a buffer, and an inverter.

18. A method, comprising:
    generating a bias voltage in response to a voltage difference between a first supply voltage and a second supply voltage being less than a threshold voltage;
    outputting via a first device and a second device of a voltage selection circuit an output signal to a higher voltage of the first supply voltage and the second supply voltage in response to the generated bias voltage; and
    providing the output signal to an NWELL of a third device of the voltage selection circuit.

19. The method of claim 18, further comprising disabling the second device by forcing a gate node of the second device to a value of the first supply voltage.

20. The method of claim 18, further comprising disabling the first device by forcing a gate node of the first device to a value of the second supply voltage.

21. The method of claim 18, further comprising:
    supplying the first supply voltage or the second supply voltage to a source of the third device; and
    supplying the first supply voltage or the second supply voltage to a gate of the third device.

* * * * *